United States Patent
Cho

(10) Patent No.: US 6,900,677 B2
(45) Date of Patent: May 31, 2005

(54) DIFFERENTIAL CHARGE PUMP AND METHOD THEREFOR, AND PHASE LOCKED LOOP AND METHOD THEREFOR USING THE PUMP AND METHOD

(75) Inventor: Young-Kyun Cho, Suwon (KW)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/693,235

(22) Filed: Oct. 24, 2003

(65) Prior Publication Data

US 2004/0135603 A1 Jul. 15, 2004

(30) Foreign Application Priority Data

Jan. 14, 2003 (KR) .............................. 10-2003-0002528

(51) Int. Cl.$^7$ ................................................. H03L 7/06
(52) U.S. Cl. ...................................................... 327/157
(58) Field of Search ............................... 327/148, 156, 327/157

(56) References Cited

U.S. PATENT DOCUMENTS

| | | | |
|---|---|---|---|
| 6,385,265 B1 | 5/2002 | Duffy et al. ................ | 375/374 |
| 6,441,660 B1 * | 8/2002 | Ingino, Jr. .................. | 327/156 |
| 6,466,070 B1 * | 10/2002 | Ross .......................... | 327/157 |
| 6,483,358 B2 * | 11/2002 | Ingino, Jr. .................. | 327/157 |
| 2002/0089382 A1 * | 7/2002 | Yang .......................... | 331/17 |

* cited by examiner

Primary Examiner—Quan Tra
(74) Attorney, Agent, or Firm—Mills & Onello LLP

(57) ABSTRACT

Disclosed is a differential charge pump and a method for pumping the same, and a phase locked loop using the pump and a method for phase locked looping. The differential charge pump comprises a first driver for receiving a first input signal and generating a first output signal; a second driver for receiving a second input signal and generating a second output signal; a third driver for receiving an inverted signal of the second input signal and generating a third output signal having the same voltage level with the first output signal; a fourth driver for receiving an inverted signal of the first input signal and generating a fourth output signal having the same voltage level with the second output signal; a first transistor having a gate connected to a first bias voltage, a source to which the first output signal is applied, and a drain connected to an output signal of a first differential charge pump; a second transistor having a gate connected to the first bias voltage, a source to which the second output signal is applied, and a drain connected to an output signal of a second differential charge pump; a third transistor having a gate connected to the second bias voltage, a source to which the third output signal is applied, and a drain connected to an output signal of the first differential charge pump: and a fourth transistor having a gate connected to a second bias voltage, a source to which the fourth output signal is applied, and a drain connected to the output signal of the second differential charge pump. Therefore, the switching noise occurring on the transition of the input signals are reduced and the performance of the system is enhanced.

8 Claims, 5 Drawing Sheets

DIFFERENTIAL CHARGE PUMP AND METHOD THEREFOR, AND PHASE LOCKED LOOP AND METHOD THEREFOR USING THE PUMP AND METHOD

This U.S. nonprovisional patent application claims priority under 35 U.S.C. § 119 of Korean Patent Application 2003-2528 filed on Jan 14, 2003, the entire contents of which are hereby incorporated by reference.

BACKGROUND OF INVENTION

1. Field of the Invention

The present invention relates to a charge pumping circuit, and more particularly to a differential charge pump and method therefor, and a phase locked loop circuit and method therefor using the pump and method for generating a differential output signal in response to a differential input signal.

2. Description of the Related Art

Generally, a phase locked loop includes a phase detector, a charge pump, a loop filter, and a voltage controlled oscillator. The phase detector detects a phase difference between a reference clock signal and a clock signal supplied from the voltage controlled oscillator. The charge pump charges or discharges the loop filter in response to an output signal of the phase detector. The voltage controlled oscillator varies a phase of the clock signal output therefrom in response to a voltage corresponding to the charge in the loop filter.

The charge pump of the phase locked loop is classified as one of two types: a single charge pumpor a differential charge pump. The single charge pump generates a single output signal, while the differential charge pump generates a differential output signal. The voltage controlled oscillator of the phase locked loop using the single charge pump generates clock signals in response to the single output signal, and the voltage controlled oscillator of the phase locked loop using the differential charge pump generates clock signals in response to the differential output signals.

Generally, in the case of a phase locked loop employing the single charge pump, switching noise is generated by performing a switching operation in response to up and down signals output from the phase detector. It is not easy to remove the noise applied to the next stage, a loop filter, since the phase locked loop generates a single output signal.

In addition, when a phase locked loop is designed by employing the differential charge pump, the switching noise is also generated by performing the switching operation in response to the up and down signals output from the phase detector. However, since the phase locked loop generates a differential output signal, the effect caused by the noise can be removed even though the noiseis applied to the next stage, the loop filter.

For the reason described above, the phase locked loop is generally designed by employing the differential charge pump rather than the single charge pump. However, even though the phase locked loop is designed using the differential charge pump, there is still a drop in performance by the switching noise occurring when the differential charge pump performs the switching operation.

Therefore, studies to reduce the switching noise of the phase locked loop employing the differential charge pump have been continued, and many technologies have been disclosed FIG. 1 shows the construction of an example of a conventional differential charge pump, which is disclosed in FIG. 4 of U.S. Pat. No. 6,385,265.

Since the construction and the operation of the differential charge pump is shown in FIG. 1 and disclosed in detail in the patent publication, only a brief explanation will be given in this specification.

The differential charge pump shown in FIG. 1 is constructed wherein up signals PUMPUPN, PUMPUPP and down signals PUMPDNN, PUMPDNP are applied to the gates of PMOS transistors 170a, 170b, 180a and 180b and NMOS transistors 172a, 172b, 178a and 178b and buffers 200a and 200b are connected between a first output signal FILTU generating terminal and a second output signal FILTD generating terminal. The switching noise generated on the switching operation of PMOS transistors 170a, 170b, 180a and 180b and NMOS transistors 172a, 172b, 178a and 178b, by up signals PUMPUPN, PUMPUPP and down signals PUMPDNN, PUMPDNP, can be removed by the buffers 200a and 200b.

The above construction has a disadvantage that it is difficult to remove the switching noise completely using the buffer 200a and 200b. Another disadvantage of the above construction is that the circuit structure is too complicated.

SUMMARY OF THE INVENTION

Therefore, it is an object of the present invention to provide a differential charge pump and a method for pumping the same capable of reducing switching noise and simplifying its circuit construction.

It is another object of the present invention to provide a phase locked loop using a differential charge pump and a method for looping the same.

In accordance with one aspect of the present invention, the above object can be accomplished by the provision of a differential charge pump comprising: a first driver for receiving a first input signal and generating a first output signal; a second driver for receiving a second input signal and generating a second output signal; a third driver for receiving an inverted signal of the second input signal and generating a third output signal having the same voltage level as the first output signal; a fourth driver for receiving an inverted signal of the first input signal and generating a fourth output signal having the same voltage level as the second output signal; a first transistor having a gate connected to a first bias voltage, a source to which the first output signal is applied, and a drain connected to an output signal of a first differential charge pump; a second transistor having a gate connected to the first bias voltage, a source to which the second output signal is applied, and a drain connected to an output signal of a second differential charge pump; a third transistor having a gate connected to the second bias voltage, a source to which the third output signal is applied, and a drain connected to an output signal of the first differential charge pump: and a fourth transistor having a gate connected to a second bias voltage, a source to which the fourth output signal is applied, and a drain connected to the output signal of the second differential charge pump.

In accordance with the present invention, the above object can be accomplished by the provision of a method for pumping a differential charge pump, comprising the steps of: receiving a first input signal, a second input signal, an inverted signal of the first input signal and an inverted signal of the second input signal as input signals and generating a first output signal, a second output signal, a third output signal having the same level with the first output signal, and a fourth output signal having the same level with the second output signal; and controlling a voltage level of the first output signal by a first bias voltage, controlling a voltage level of the third output signal by a second bias voltage and then generating an output signal of a first differential charge pump, controlling a voltage level of the second output signal by the first bias voltage, controlling a voltage level of the fourth output signal by the second bias voltage and then generating an output signal of a second differential charge pump.

In accordance with the present invention, another object can be accomplished by the provision of a phase locked loop having a phase detection means for detecting a phase difference between a reference clock signal and a desired clock signal and generating a first input signal, a second input signal, an inverted signal of the first input signal and an inverted signal of the second input signal; a differential charge pump for receiving the first input signal, the second input signal, the inverted signal of the first input signal and the inverted signal of the second input signal as input signals and generating an output signal of a first differential charge pump and an output signal of a second differential charge pump; a loop filter for charging and discharging in response to the output signal of the first differential charge pump and the output signal of the second differential charge pump; and a voltage controlled oscillator for receiving the output signal of the first differential charge pump and the output signal of the second differential charge pump as input signals and controlling the phase of the desired clock signal wherein the differential charge pump comprises: a first driver for receiving a first input signal and generating a first output signal; a second driver for receiving a second input signal and generating a second output signal; a third driver for receiving an inverted signal of the second input signal and generating a third output signal having the same voltage level with the first output signal; a fourth driver for receiving an inverted signal of the first input signal and generating a fourth output signal having the same voltage level with the second output signal; a first transistor having a gate connected to a first bias voltage, a source to which the first output signal is applied, and a drain connected to an output signal of a first differential charge pump; a second transistor having a gate connected to the first bias voltage, a source to which the second output signal is applied, and a drain connected to an output signal of a second differential charge pump; a third transistor having a gate connected to the second bias voltage, a source to which the third output signal is applied, and a drain connected to an output signal of the first differential charge pump: and a fourth transistor having a gate connected to a second bias voltage, a source to which the fourth output signal is applied, and a drain connected to the output signal of the second differential charge pump.

In accordance with the present invention, another object can be accomplished by the provision of a method of phase locked looping, comprising the steps of: detecting a phase to detect a phase difference between a reference clock signal and a desired clock signal and generating a first input signal, a second input signal, an inverted signal of the first input signal, and an inverted signal of the second input signal; charge pumping to receive a first input signal, a second input signal, an inverted signal of the first input signal, and an inverted signal of the second input signal as input signals and then generating a first output signal, a second output signal, a third output signal having the same level as the first output signal, and a fourth output signal having the same level as the second output signal, and controlling a voltage level of the first output signal by a first bias voltage, controlling a voltage level of the third output signal by a second bias voltage and then generating an output signal of a first differential charge pump, and controlling a voltage level of the second output signal by the first bias voltage, controlling a voltage level of the fourth output signal by the second bias voltage and then generating an output signal of a second differential charge pump; charging and discharging in response to the output signals of the first differential charge pump and the second differential charge pump; and controlling a phase of the desired clock signal in response to the output signals of the first differential charge pump and the second differential charge pump.

BRIEF DESCRIPTION OF THE DRAWINGS

The above and other objects, features and advantages of the invention will be more clearly understood from the following detailed description taken in conjunction with the accompanying drawings. Throughout the drawings, like reference numerals refer to like elements. The drawings are not necessarily to scale, emphasis instead being placed on illustrating the features of the invention.

DETAILED DESCRIPTION OF THE PREFERRED EMBODIMENT

Figure 1:
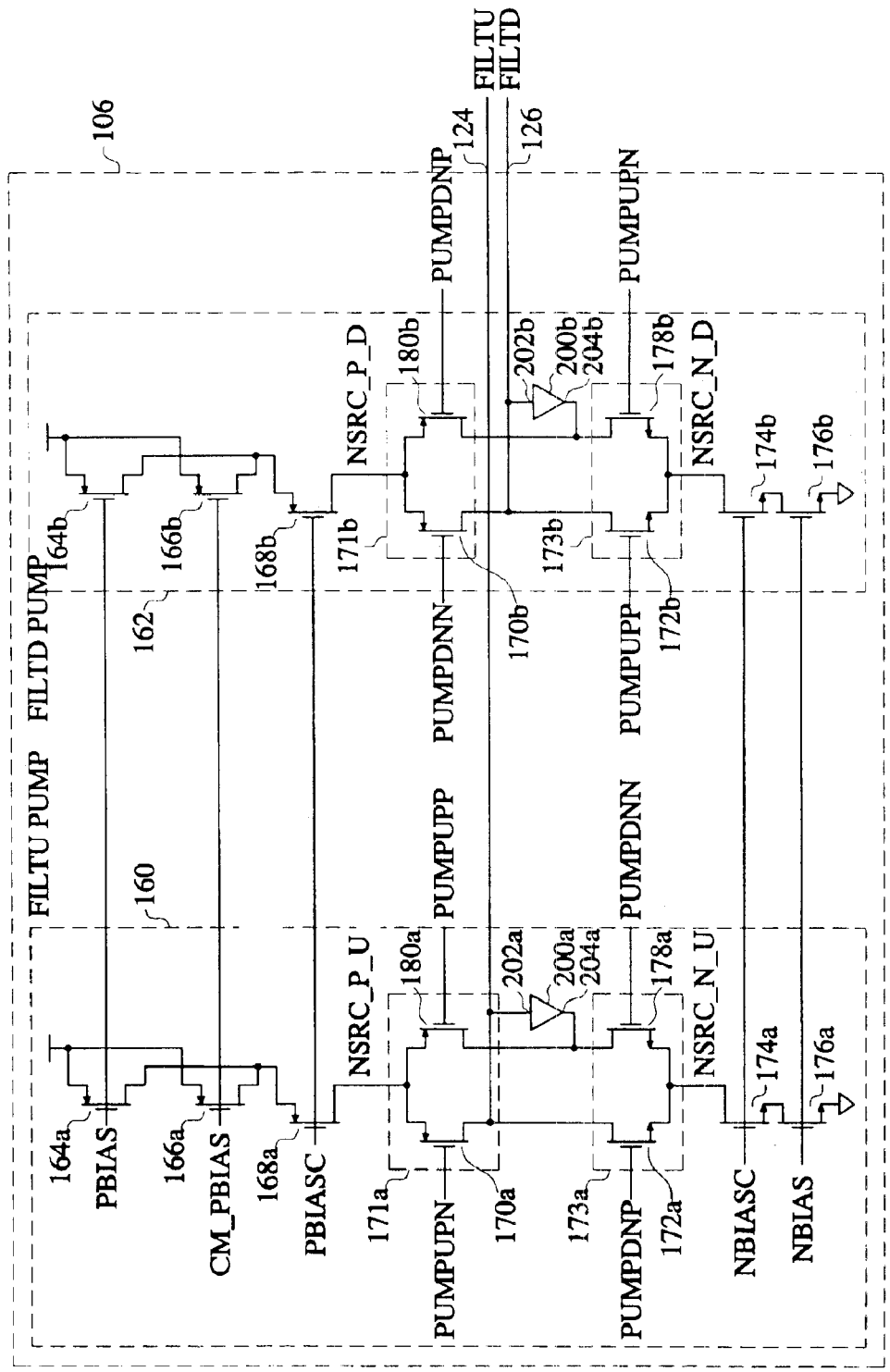
FIG. 1 illustrates the construction of a differential charge pump in accordance with an example of the conventional art.
Figure 2:
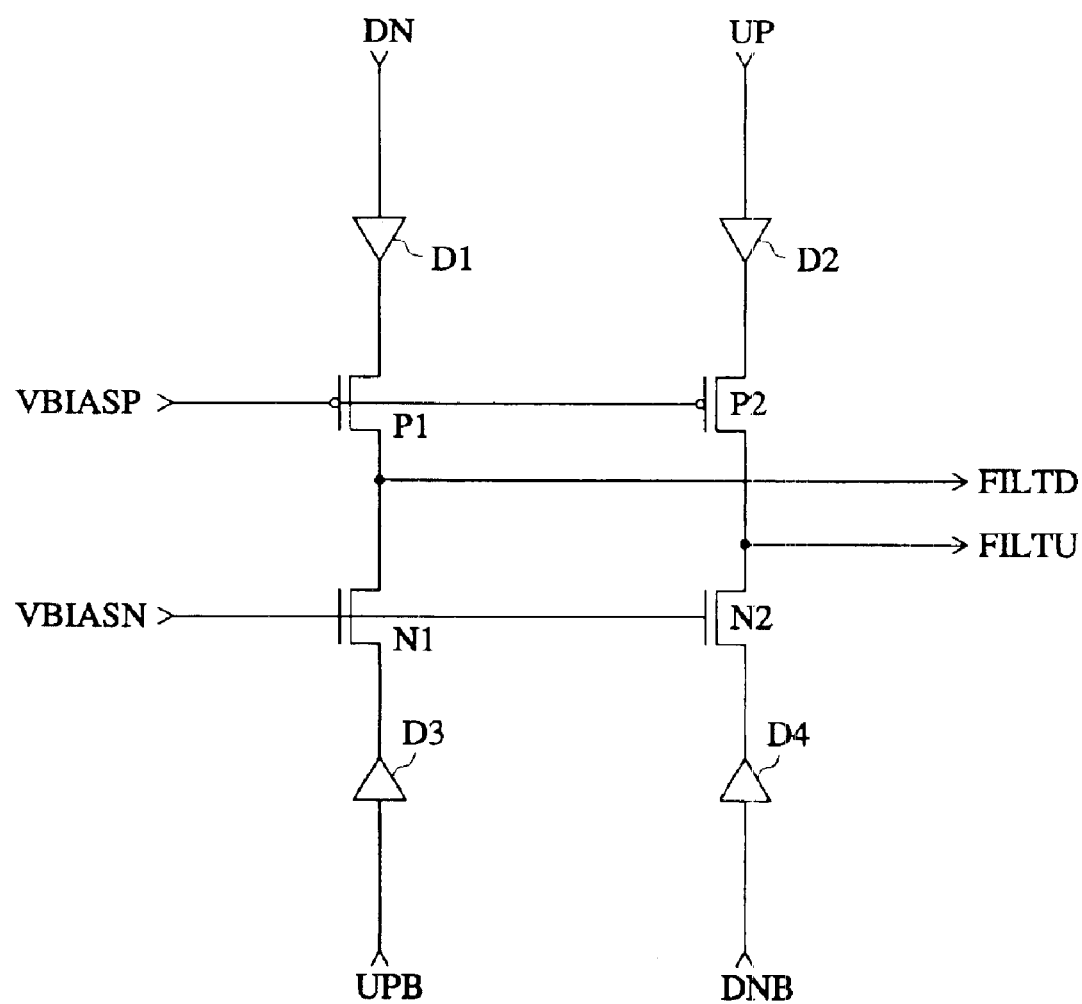
FIG. 2 is a circuit diagram illustrating the construction of a differential charge pump in accordance with an exemplary embodiment of the present invention.

FIG. 2 is a circuit diagram of an embodiment of a differential charge pump in accordance with an exemplary embodiment of the present invention, including drivers D1 to D4, PMOS transistors P1 and P2, and NMOS transistors N1 and N2.

Drivers D1 to D4 receive a down signal DN, an up signal UP, an inverted up signal UPB, and an inverted down signal DNB, respectively. PMOS transistor P1, which is a first transistor, has a source connected to an output signal of a first driver D1, a gate connected to a first bias voltage VBIASP, and a drain connected to an output signal FILTD generating terminal of a first differential charge pump. NMOS transistor N1, which is a third transistor, has a drain connected to the output signal FILTD generating terminal of the first differential charge pump, a gate connected to a second bias voltage VBIASN, and a source connected to an output signal of a third driver D3. PMOS transistor P2, which is a second transistor, has a source connected to an output signal of the second driver D2, a gate connected to the first bias voltage VBIASP, and a drain connected to the output signal FILTU generating terminal of the second differential charge pump. NMOS transistor N2, which is a fourth transistor, has a drain connected to the output signal FILTU generating terminal of the second charge pump, a gate connected to the second bias voltage VBIASN, and a source connected to the output signal of the fourth driver D4.

The operation of the differential charge pump shown in FIG. 2 will now be described.

In the case in which the bias voltages VBIASP, VBIASN are applied and an up signal UP of a "high" level and a down signal DN of a "low" level are applied, the inverted up signal UPB is at the "low" level and the inverted down signal DNB is at the "high" level.

The first and the fourth drivers D1, D4 receive a down signal DN of "low" is at the "low" level.

The first and the fourth drivers D1, D4 receive a down signal DN of "high" level and an inverted down signal DNB of "low" level as input signals and generate signals of supply voltage level and ground voltage level, respectively. And, the second and the third drivers D2, D3 receive an up signal UP of "low" level and an inverted up signal UPB of "high" level as input signals and generate a signal of the ground voltage level and the a signal of the supply voltage level, respectively.

PMOS transistor P1 is turned on and the NMOS transistor N1 is turned off, so the charge of the output signal of the driver D1 is charged to the output signal FILTD generating terminal of the first differential charge pump through the PMOS transistor P1. And PMOS transistor P2 is turned off and NMOS transistor N2 is turned on, so the charge on the output signal FILTU generating terminal of the second differential charge pump is discharged through the NMOS transistor N2. That is, when the ground voltage and the supply voltage are applied to each source of the PMOS transistors P1, P2, and each source of the NMOS transistors N1, N2, the PMOS transistor P2 and the NMOS transistor N1 become a current source and cause the current to flow. On the other hand, when the supply voltage and the ground voltage levels are applied to each source of the PMOS transistors P1, P2, and each source of NMOS transistors N1, N2, the PMOS transistor P1 and the NMOS transistor N2 become a current source and occur the current to flow.

As described above, the differential charge pump of the present invention is configured such that the up and down signals UP, DN and the inverted up and down signals UPB, DNB are transitioned and then the supply voltage or the ground voltage levels are applied to the sources of the transistors P1, P2, N1, N2 in the state of the bias voltages VBIASP, VBIASN are applied to the gates of the PMOS transistors P1, P2 and NMOS transistors N1, N2. Accordingly, since these transistors P1, P2, N1, N2 and each of the drivers D1, D2, D3, D4 is connected in serial on the switching operation, the switching noise caused by the switching operation and a parasitic capacitance can be reduced.

Figure 3:
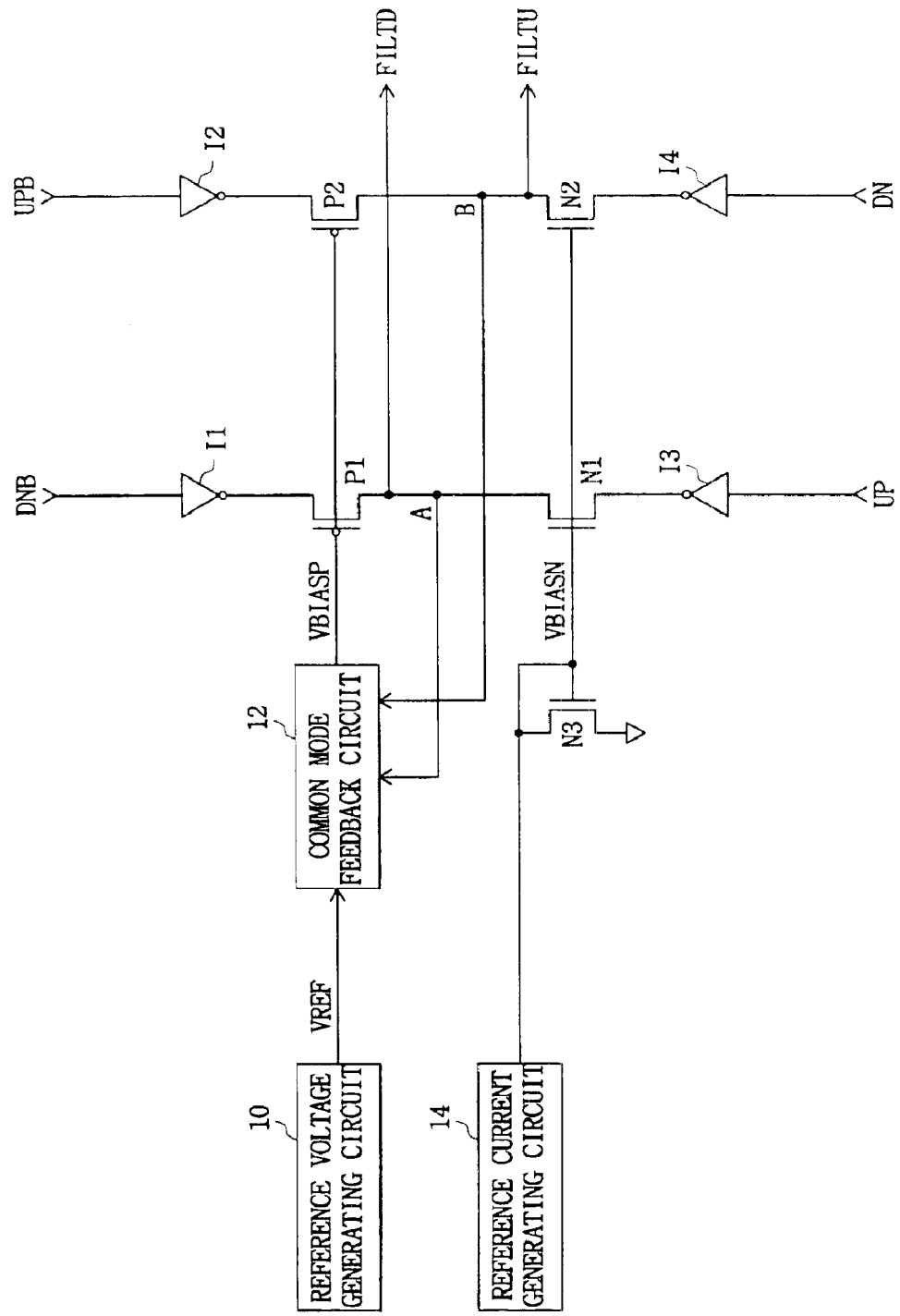
FIG. 3 illustrates the construction of a differential charge pump in accordance with an embodiment of the present invention.

FIG. 3 illustrates a differential charge pump in accordance with a preferred embodiment of the present invention. The pump includes a reference voltage generating circuit 10, a common mode feedback circuit 12, a reference current generating circuit 14, inverters I1 to I4, PMOS transistors P1, P2, and NMOS transistors N1, N2.

In FIG. 3, the drivers D1 to D4 shown in FIG. 2 are constructed as inverters I1 to I4 respectively, and the inverted down signal DNB, the inverted up signal UPB, the up signal UP, and the down signal DN are respectively applied to the inverters I1 to I4. In FIG. 3, by constructing drivers D1 to D4 as the inverters I1 to I4, a signal having a reverse phase to the signals applied to the drivers D1 to D4 shown in FIG. 2 is applied.

Operation of the circuit shown in FIG. 3 will now be described.

A reference voltage generating circuit 10 generates a reference voltage VREF. A common mode feedback circuit 12 compares voltages of nodes A, B with the reference voltage VREF and generates a constant bias voltage VBIASP. That is, the common mode feedback circuit 12 generates a constant bias voltage by raising the first bias voltage VBIASP when the voltages of nodes A, B are lower than the reference voltage VREF and by lowering the first bias voltage VBIASP when the voltages of nodes A, B are higher than the reference voltage VREF. A reference current generating circuit 14 generates a reference current. NMOS transistor N3 causes the reference current to flow and generates a bias voltage VBIASN.

When an inverted down signal DNB of "high" level and a down signal DN of "low" level, and an inverted up signal UPB of "low" level and an up signal of "high" level are applied, inverters I1 to I4 output a signal of the ground voltage level, a signal of the supply voltage level, a signal of the ground voltage level, and a signal of supply voltage level, respectively. Then, the PMOS transistor P1 and the NMOS transistor N2 are turned off, and the PMOS transistor P2 and the NMOS transistor N1 are turned on. Accordingly, the supply voltage is charged to the output signal FILTU generating terminal of the second differential charge pump through the PMOS transistor P2. Then, the charge on the output signal FILTD generating terminal of the first differential charge pump is discharged to the ground voltage through the NMOS transistor N1. That is, in the state that the first bias voltage VBIASP is applied to the gate of the PMOS transistor P2, when the supply voltage is applied to the source of the PMOS transistor P2, the PMOS transistor P2 becomes a current source and makes a current flow to the output signal FILTU generating terminal of the second differential charge pump. And, in the state that the second bias voltage VBIASN is applied to the gate of NMOS transistor N1, the ground voltage is applied to the source of the NMOS transistor N1, the NMOS transistor N1 becomes the current source and makes a current flow from the output signal FILTD generating terminal of the first differential charge pump to the ground voltage.

On the other hand, when an inverted down signal DNB of "low" level and a down signal DN of "high" level, and an inverted up signal UPB of "high" level and an up signal UP of "low" level are applied, inverters I1 to I4 output a signal of the supply voltage level, a signal of the ground voltage level, a signal of the supply voltage level, and a signal of ground voltage level, respectively. Then, the PMOS transistor P1 and the NMOS transistor N2 are turned on, and the PMOS transistor P2 and the NMOS transistor N1 are turned off. Accordingly, the supply voltage is charged to the output signal FILTD generating terminal of the first differential charge pump through the PMOS transistor P1 and the charge on the output signal FILTU generating terminal of the second differential charge pump is discharged through the NMOS transistor N2. That is, in the state that the first bias voltage VBIASP is applied to the gate of the PMOS transistor P1, if the supply voltage is applied to the source of the PMOS transistor P1, the PMOS transistor P1 becomes a current source and provides current to the output signal FILTD generating terminal of the first differential charge pump. And, in the state that the second bias voltage VBIASN is applied to the gate of NMOS transistor N2, when the ground voltage is applied to the source of the NMOS transistor N2, the NMOS transistor N2 becomes the current source and makes a current flow from the output signal FILTU generating terminal of the second differential charge pump to the ground voltage.

As described above, the differential charge pump of the present invention makes the current flow to the output signals FILTD generating terminal, FILTU of the first and the second differential charge pumps since the PMOS transistors P1, P2, and NMOS transistor N1, N2 become the current source by the voltage applied to the sources of the PMOS transistors P1, P2 and NMOS transistors N1, N2, in the state that the bias voltages VBIASP, VBIASN are applied.

In the differential charge pump of the present invention, since the PMOS transistors P1, P2 and NMOS transistors N1, N2 are serially connected to each driver D1, D2, D3, D4, the switching noise caused by the switching and the parasitic capacitance can be reduced.

Figure 4:
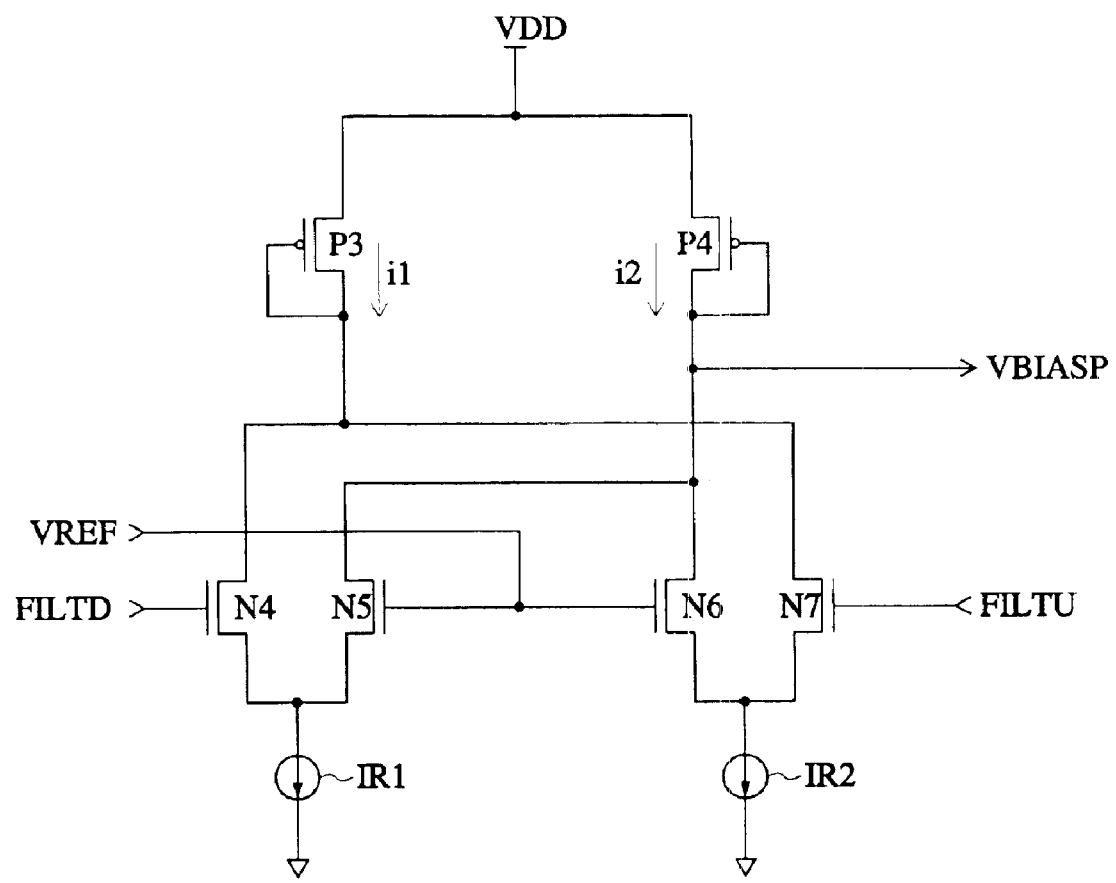
FIG. 4 is a circuit diagram illustrating an exemplary embodiment of a common mode feedback circuit shown in FIG. 3.

FIG. 4 is a circuit diagram showing a common mode feedback circuit shown in FIG. 3, including PMOS transistors P3, P4, NMOS transistors N4 to N7, and current sources IR1, IR2.

The operation of the circuit shown in FIG. 4 will now be described.

The NMOS transistors N5, N6 are turned on in response to a reference voltage VREF to make a current i2 flow. And the NMOS transistors N4, N7 are turned on in response to the output signal FILTD of the first differential charge pump and the output signal FILTU of the second differential charge pump to make current i1 flow.

If the PMOS transistors P3, P4 are designed to be the same size as the NMOS transistors N4 to N7, and the sum of the voltage of the output signal FILTD of the first differential charge pump and the voltage of the output signal FILTU of the second differential charge pump is higher than two times the reference voltage VREF, the NMOS transistors N4, N7 are turned on more heavily than the NMOS transistors N5, N6 and current i1 is larger than current i2. Accordingly, the voltage of the first bias voltage VBIASP rises therefrom.

On the other hand, when the sum of the voltage of the output signal FILTD of the first differential charge pump and the voltage of the output signal FILTU of the second differential charge pump is lower than two times the reference voltage VREF, the NMOS transistors N5, N6 are turned on more heavily than the NMOS transistors N4, N7 and current i2 is larger than current i1. Accordingly, the voltage of the first bias voltage VBIASP decreases therefrom.

A common mode feedback circuit shown in FIG. 4 also operates as described above. So, it generates a first bias voltage VBIASP constantly when the sum of the voltage of the output signal FILTD of the first differential charge pump with the voltage of the output signal FILTU of the second differential charge pump is the same as two times of the reference voltage VREF.

Figure 5:
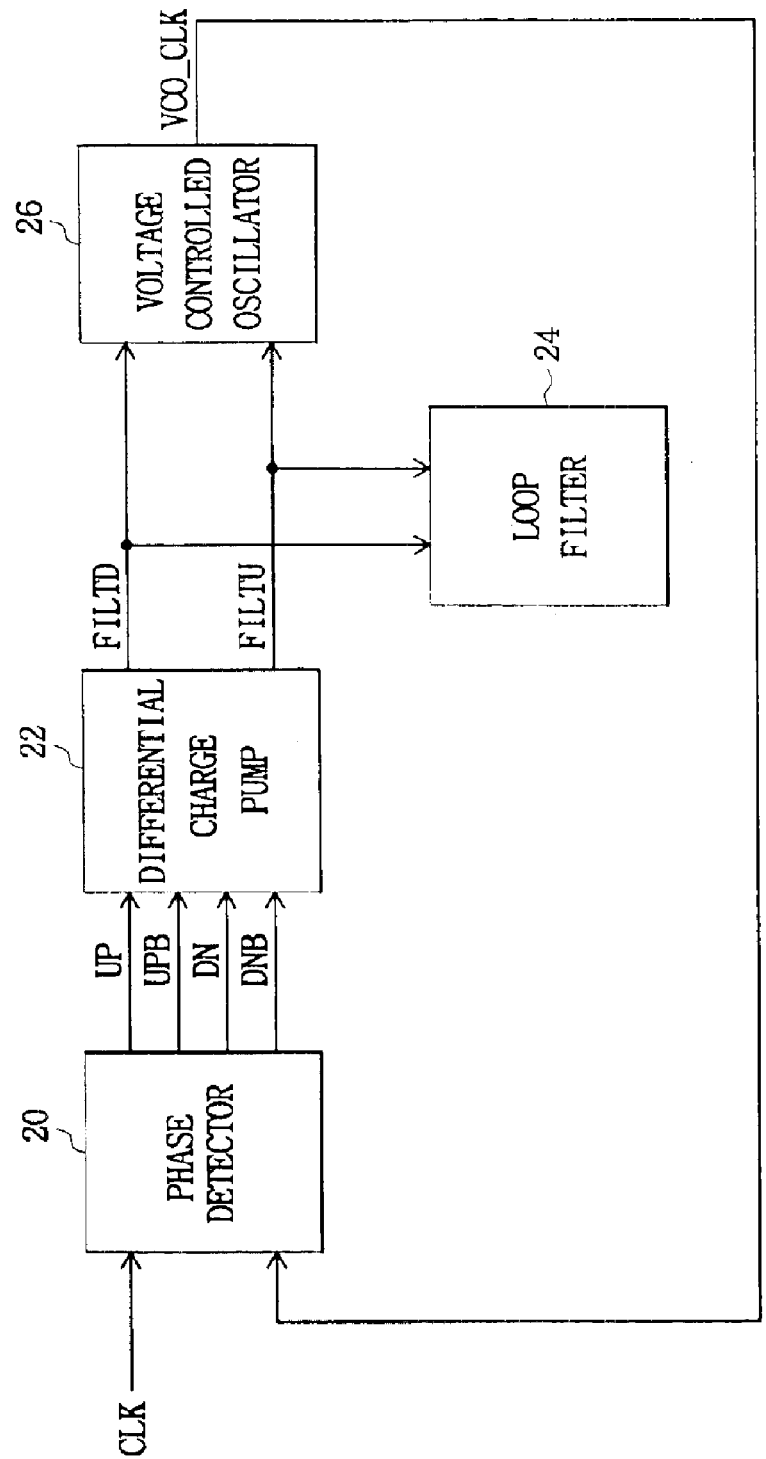
FIG. 5 is a block diagram illustrating the construction of a phase locked loop using a differential charge pump in accordance with the present invention.

FIG. 5 is a block diagram showing a phase locked loop using a differential charge pump in accordance with the present invention, including a phase detector 20, a differential charge pump 22, a loop filter 24, and a voltage controlled oscillator 26.

The functions of the blocks shown in FIG. 5 will now be described.

The phase detector 20 receives a reference clock CLK and VCO_clock signal VCO_CLK as input signals. Then, when a phase of VCO_clock signal VCO_CLK is delayed relative to that of a reference clock signal CLK, the detector generates an up signal UP and an inverted down signal DNB of "high" level, and a down signal DN and an inverted up signal UPB of "low" level. When the phase of VCO_clock signal VCO_CLK goes ahead of that of reference clock signal CLK, the detector generates a down signal DN and an inverted up signal UPN of "high" level, and an inverted down signal DNB and an up signal UP of "low" level. The differential charge pump 22 charges the output signal FILTU generating terminal of the second differential charge pump in response to the up signal UP and the inverted down signal DNB of "high" level, and the down signal DN and the inverted up signal UPB of "low" level. The differential charge pump discharges the output signal FILTD generating terminal of the first differential charge pump, so that the voltage difference between the output signal FILTD of the first differential charge pump and output signal FILTU of the second differential charge pump becomes higher. And, the differential charge pump charges the output signal FILTD generating terminal of the first differential charge pump in response to the down signal DN and the inverted up signal UPN of "high" level, and the inverted down signal DNB and up signal UP of "low" level. The differential charge pump discharges the output signal FILTU generating terminal of the second differential charge pump, so that the voltage difference between the output signal FILTD of the first differential charge pump and output signal FILTU of the second differential charge pump becomes lower. The loop filter 24 is connected to the output signal FILTD generating terminal of the first differential charge pump and the output signal FILTU generating terminal of the second differential charge pump to charge and discharge an individual output signal. The voltage controlled oscillator 26 generates VCO_clock signal VCO_CLK quickly when the voltage difference between the output signal FILTD of the first differential charge pump and the output signal FILTU of the second differential charge pump becomes higher, and generates the VCO_clock signal VCO_CLK slowly when the voltage difference becomes lower.

The phase locked loop using the differential charge pump of the present invention can reduce switching noise by using the differential charge pump of the present invention.

Therefore, the differential charge pump of the present invention and the method for pumping the same, and the phase locked loop using the pump and the method for phase locked looping can reduce the switching noise caused when the up and down signals are transitioned, and their performances can be improved.

The differential charge pump of the present invention and the phase locked loop using the pump make the circuit construction simpler, and therefore reduce its layout size when they are integrated.

While this invention has been described in connection with what is presently considered to be the most practical and preferred embodiment, it is to be understood that the invention is not limited to the disclosed embodiment, but on the contrary, it is intended to cover various modifications within the spirit and scope of the invention, which is set forth in the appended claims.

What is claimed is:

1. A differential charge pump comprising:
   a first driver for receiving a first input signal and generating a first output signal;
   a second driver for receiving a second input signal and generating a second output signal;
   a third driver for receiving an inverted signal of the second input signal and generating a third output signal having the same voltage level as the first output signal;
   a fourth driver for receiving an inverted signal of the first input signal and generating a fourth output signal having the same voltage level as the second output signal;
   a first transistor having a gate connected to a first bias voltage, a source to which the first output signal is applied, and a drain connected to an output signal of a first differential charge pump;

a second transistor having a gate connected to the first bias voltage, a source to which the second output signal is applied, and a drain connected to an output signal of a second differential charge pump;

a third transistor having a gate connected to a second bias voltage, a source to which the third output signal is applied, and a drain connected to an output signal of the first differential charge pump:

a fourth transistor having a gate connected to the second bias voltage, a source to which the fourth output signal is applied, and a drain connected to the output signal of the second differential charge pump;

a reference voltage generating circuit for generating a reference voltage;

a reference current generating circuit for generating a reference current and having its output connected to the second bias voltage;

a common mode feedback circuit for receiving the output of the reference voltage, the output signal of the first differential charge pump and the output signal of the second differential charge pump as inputs and generating the first bias voltage; and a fifth transistor having a drain and a gate connected to the second bias voltage, and a source connected to the ground voltage.

2. The differential charge pump according to claim 1, wherein the first input signal is a down signal, and the second input signal is an up signal, and the first to the fourth drivers are buffers.

3. The differential charge pump according to claim 1, wherein the first input signal is an inverted down signal, and the second input signal is an inverted up signal, and the first to the fourth drivers are inverters.

4. A phase locked loop having a phase detection means for detecting a phase difference between a reference clock signal and a desired clock signal and generating a first input signal, a second input signal, an inverted signal of the first input signal and an inverted signal of the second input signal;

a differential charge pump for receiving the first input signal, the second input signal, the inverted signal of the first input signal and the inverted signal of the second input signal as input signals and generating an output signal of a first differential charge pump and an output signal of a second differential charge pump;

a loop filter for charging and discharging in response to the output signal of the first differential charge pump and the output signal of the second differential charge pump; and a voltage controlled oscillator for receiving the output signal of the first differential charge pump and the output signal of the second differential charge pump as input signals and controlling the phase of the desired clock signal, wherein the differential charge pump comprises:

a first driver for receiving a first input signal and generating a first output signal;

a second driver for receiving a second input signal and generating a second output signal;

a third driver for receiving an inverted signal of the second input signal and generating a third output signal having the same voltage level with the first output signal;

a fourth driver for receiving an inverted signal of the first input signal and generating a fourth output signal having the same voltage level with the second output signal;

a first transistor having a gate connected to a first bias voltage, a source to which the first output signal is applied, and a drain connected to an output signal of a first differential charge pump;

a second transistor having a gate connected to the first bias voltage, a source to which the second output signal is applied, and a drain connected to an output signal of a second differential charge pump;

a third transistor having a gate connected to a second bias voltage, a source to which the third output signal is applied, and a drain connected to an output signal of the first differential charge pump:

a fourth transistor having a gate connected to the second bias voltage, a source to which the fourth output signal is applied, and a drain connected to the output signal of the second differential charge pump;

a reference voltage generating circuit for generating a reference voltage;

a reference current generating circuit for generating a reference current and having its output connected to the second bias voltage;

a common mode feedback circuit for receiving the output of the reference voltage, the output signal of the first differential charge pump and the output signal of the second differential charge pump as inputs and generating the first bias voltage; and a fifth transistor having a drain and a gate connected to the second bias voltage, and a source connected to the ground voltage.

5. The phase locked loop according to claim 4, wherein the first input signal is a down signal, and the second input signal is an up signal, and the first to the fourth drivers are buffers.

6. The phase locked loop according to claim 4, wherein the first input signal is an inverted down signal, and the second input signal is an inverted up signal, and the first to the fourth drivers are inverters.

7. A method for pumping a differential charge pump, comprising:

receiving a first input signal, a second input signal, an inverted signal of the first input signal and an inverted signal of the second input signal as input signals and generating a first output signal, a second output signal, a third output signal having the same level with the first output signal, and a fourth output signal having the same level with the second output signal; and controlling a voltage level of the first output signal by a first bias voltage, controlling a voltage level of the third output signal by a second bias voltage and then generating an output signal of a first differential charge pump, controlling a voltage level of the second output signal by the first bias voltage, controlling a voltage level of the fourth output signal by the second bias voltage and then generating an output signal of a second differential charge pump, receiving a reference voltage and the output signals of the first and second differential charge pumps as input signals and generating the first bias voltage, and generating the second bias voltage using the reference current.

8. A method for phase locked looping, comprising:

detecting a phase detect a phase difference between a reference clock signal and a desired clock signal and generating a first input signal, a second input signal, an inverted signal of the first input signal, and an inverted signal of the second input signal;

charge pumping to receive a first input signal, a second input signal, an inverted signal of the first input signal, and an inverted signal of the second input signal as input signals and then generating a first output signal, a second output signal, a third output signal having the same level as the first output signal, and a fourth output signal having the same level as the second output signal, and controlling a voltage level of the first output signal by a first bias voltage, controlling a voltage level of the third output signal by a second bias voltage and then generating an output signal of a first differential charge pump, and controlling a voltage level of the second output signal by the first bias voltage, controlling a voltage level of the fourth output signal by the second bias voltage and then generating an output signal of a second differential charge pump, receiving a reference voltage and the output signals of the first and second differential charge pumps as input signals and then generating the first bias voltage, and controlling the second bias voltage using the reference current;

charging and discharging in response to the output signals of the first differential charge pump and the second differential charge pump; and controlling a phase of the desired clock signal in response to the output signals of the first differential charge pump and the second differential charge pump.

\* \* \* \* \*